United States Patent
Le Neel et al.

(10) Patent No.: US 8,809,861 B2
(45) Date of Patent: Aug. 19, 2014

(54) THIN FILM METAL-DIELECTRIC-METAL TRANSISTOR

(75) Inventors: Olivier Le Neel, Singapore (SG); Ravi Shankar, Singapore (SG); Calvin Leung, Singapore (SG)

(73) Assignee: STMicroelectronics Pte Ltd., Singapore (SG)

( * ) Notice: Subject to any disclaimer, the term of this patent is extended or adjusted under 35 U.S.C. 154(b) by 646 days.

(21) Appl. No.: 12/981,375

(22) Filed: Dec. 29, 2010

(65) Prior Publication Data

US 2012/0168754 A1 Jul. 5, 2012

(51) Int. Cl.
*H01L 29/786* (2006.01)
*H01L 49/00* (2006.01)

(52) U.S. Cl.
CPC .............. *H01L 49/00* (2013.01); *Y10S 257/902* (2013.01)
USPC .............. 257/57; 257/213; 257/347; 257/368; 257/902; 257/E21.409; 257/E27.06; 257/E29.255; 257/E29.273; 257/E49.001

(58) Field of Classification Search
USPC ......... 257/43, E29.273, 59, E27.06, E29.296, 257/57, E21.409, E21.411, E29.068, 257/E33.053, E21.412, E21.46, 66, 257/E29.323, E51.018, 40, 421, 72, 213, 257/347, 368, 902, E29.255, E49.001
See application file for complete search history.

(56) References Cited

U.S. PATENT DOCUMENTS

| | | | |
|---|---|---|---|
| 3,289,046 A | 11/1966 | Carr | |
| 3,416,959 A | 12/1968 | Cormia | |
| 4,104,607 A | 8/1978 | Jones | |
| 4,125,854 A | 11/1978 | McKenny et al. | ............... 357/41 |
| 4,392,992 A | 7/1983 | Paulson et al. | |
| 4,497,998 A | 2/1985 | West | |
| 4,746,896 A | 5/1988 | Mcquaid et al. | |
| 4,752,814 A | 6/1988 | Tuan | |
| 4,766,411 A | 8/1988 | Prieto et al. | |
| 4,876,668 A | 10/1989 | Thakoor et al. | |
| 5,037,766 A | 8/1991 | Wang | ............... 437/24 |
| 5,041,800 A | 8/1991 | Long et al. | |
| 5,135,888 A | 8/1992 | Chan et al. | ............... 437/186 |
| 5,152,869 A | 10/1992 | Ferraris et al. | |
| 5,268,651 A | 12/1993 | Kerth | |
| 5,468,672 A | 11/1995 | Rosvold | |
| 5,485,138 A | 1/1996 | Morris | |

(Continued)

FOREIGN PATENT DOCUMENTS

JP 61100956 A 5/1986
WO 2005/093868 A1 10/2005

OTHER PUBLICATIONS

S. Privitera, F. Wang, C. Niu, P. Dumont-Girard, H. Ding, K. Liu, R. Modica, C. Bongiorno, "Morphological and electrical characterization of SixCrvCzBv thin film", Sep. 13, 2009, Micrelectronic Engineering, 87 (2010) 430-433.*

(Continued)

*Primary Examiner* — Ermias Woldegeorgis
(74) *Attorney, Agent, or Firm* — Seed IP Law Group PLLC

(57) ABSTRACT

A transistor is formed having a thin film metal channel region. The transistor may be formed at the surface of a semiconductor substrate, an insulating substrate, or between dielectric layers above a substrate. A plurality of transistors each having a thin film metal channel region may be formed. Multiple arrays of such transistors can be vertically stacked in a same device.

14 Claims, 9 Drawing Sheets

(56) References Cited

U.S. PATENT DOCUMENTS

| | | | |
|---|---|---|---|
| 5,494,845 A | 2/1996 | Sereda et al. | |
| 5,503,878 A | 4/1996 | Suzuki et al. | |
| 5,623,097 A | 4/1997 | Horiguchi et al. | |
| 5,635,893 A | 6/1997 | Spraggins et al. | |
| 5,640,023 A | 6/1997 | Balasinski et al. | 257/66 |
| 5,656,524 A | 8/1997 | Eklund et al. | |
| 5,821,960 A | 10/1998 | Mitani | |
| 5,844,208 A | 12/1998 | Tustaniwskyj et al. | |
| 6,211,032 B1 | 4/2001 | Redford et al. | |
| 6,274,452 B1 | 8/2001 | Miura et al. | |
| 6,281,090 B1 | 8/2001 | Kukanskis et al. | |
| 6,324,093 B1 | 11/2001 | Perner et al. | |
| 6,426,268 B1 | 7/2002 | Huppert et al. | |
| 6,466,124 B1 | 10/2002 | Shibuya et al. | |
| 6,504,226 B1 | 1/2003 | Bryant | 257/510 |
| 6,873,543 B2 | 3/2005 | Smith et al. | |
| 6,890,810 B2 | 5/2005 | Amadon et al. | |
| 6,891,747 B2 | 5/2005 | Bez et al. | |
| 7,009,208 B2 | 3/2006 | Aratani et al. | |
| 7,213,327 B2 | 5/2007 | Su et al. | |
| 7,259,040 B2 | 8/2007 | Pellizer et al. | 438/102 |
| 7,338,637 B2 | 3/2008 | Pease et al. | |
| 7,381,981 B2 | 6/2008 | Aitken et al. | |
| 7,410,246 B2 | 8/2008 | Bell et al. | |
| 7,410,879 B1 | 8/2008 | Hill et al. | |
| 7,411,818 B1 | 8/2008 | Elmegreen et al. | |
| 7,416,951 B2 | 8/2008 | Beach et al. | |
| 7,425,724 B2 | 9/2008 | Aratani et al. | |
| 7,427,926 B2 | 9/2008 | Sinclair et al. | 340/825.2 |
| 7,553,002 B2 | 6/2009 | Baek | |
| 7,605,079 B2 | 10/2009 | Lai et al. | |
| 7,633,079 B2 | 12/2009 | Chen et al. | |
| 7,635,998 B1 | 12/2009 | Taki | |
| 7,652,279 B2 | 1/2010 | Krusin-Elbaum et al. | |
| 7,724,562 B2 | 5/2010 | Meyer et al. | |
| 7,724,564 B2 | 5/2010 | Taylor et al. | |
| 7,787,282 B2 | 8/2010 | Ramani et al. | |
| 7,820,996 B2 | 10/2010 | Lee et al. | |
| 7,838,875 B1* | 11/2010 | Tsang | 257/43 |
| 7,863,598 B2 | 1/2011 | Sugita et al. | |
| 7,883,930 B2 | 2/2011 | Tsukamoto et al. | |
| 7,969,806 B2 | 6/2011 | De Ambroggi et al. | |
| 7,978,540 B2 | 7/2011 | Bardouillet et al. | |
| 8,000,127 B2 | 8/2011 | Hamilton et al. | |
| 8,093,535 B2 | 1/2012 | Heismann et al. | |
| 8,129,706 B2 | 3/2012 | Ho et al. | |
| 8,169,811 B2 | 5/2012 | Li et al. | |
| 8,169,819 B2 | 5/2012 | Shima et al. | |
| 8,174,877 B2 | 5/2012 | Baks | |
| 8,208,294 B2 | 6/2012 | Happ et al. | |
| 8,212,184 B2 | 7/2012 | Mowry et al. | |
| 8,242,497 B2 | 8/2012 | Tsang | |
| 8,242,876 B2 | 8/2012 | Le Neel et al. | |
| 8,326,426 B2 | 12/2012 | Thornton et al. | |
| 8,334,525 B2 | 12/2012 | Nakai et al. | |
| 8,400,257 B2 | 3/2013 | Lim et al. | |
| 8,436,426 B2 | 5/2013 | Le Neel et al. | |
| 8,488,359 B2 | 7/2013 | Chung | |
| 8,493,171 B2 | 7/2013 | Le Neel et al. | |
| 8,526,214 B2 | 9/2013 | Le Neel | |
| 2003/0150101 A1 | 8/2003 | Park et al. | |
| 2003/0155591 A1* | 8/2003 | Kreupl | 257/288 |
| 2005/0052498 A1 | 3/2005 | Delametter et al. | |
| 2006/0027892 A1 | 2/2006 | Yamashita et al. | |
| 2006/0054953 A1 | 3/2006 | Son et al. | |
| 2006/0224753 A1 | 10/2006 | Hama et al. | |
| 2007/0170546 A1 | 7/2007 | Beach | |
| 2007/0189053 A1 | 8/2007 | Pellizzer et al. | |
| 2008/0048242 A1 | 2/2008 | Choi et al. | |
| 2008/0217740 A1 | 9/2008 | Shiramizu et al. | |
| 2010/0073122 A1 | 3/2010 | Le Neel et al. | 338/25 |
| 2012/0049323 A1 | 3/2012 | Ng et al. | |
| 2012/0049324 A1 | 3/2012 | Le Neel et al. | |
| 2012/0049997 A1 | 3/2012 | Lim et al. | |
| 2012/0085748 A1 | 4/2012 | Le Neel et al. | |
| 2012/0170352 A1 | 7/2012 | Le Neel et al. | |
| 2012/0266452 A1 | 10/2012 | Le Neel et al. | |

OTHER PUBLICATIONS

Hieber, K., and R. Dittman, "Structural and Electrical Properties of CrSi$_2$ Thin Film Resistors," *Thin Solid Films* 36(2):357-360, Aug. 1976.

Nishida, I., and T. Sakata, "Semiconducting Properties of Pure and Mn-Doped Chromium Disilicides," *Journal of Physics and Chemistry of Solids* 39(5):499-505, Jan. 1978.

Nishida, S., et al., "A New Self-Aligned A-SI TFT Using Ion Doping and Chromium Silicide Formation," *Materials Research Society Proceedings* 219:303-308, Apr. 1991.

Extended European Search Report, dated Apr. 20, 2012, for European Application No. 11195500.1, 10 pages.

Le Neel et al., "Multi-Layer Via-Less Thin Film Resister," U.S. Appl. No. 12/862,594, Office Action, dated Jan. 30, 2012, 12 pages.

Colgan et al., "Phase formation in Cr—Si thin-film interactions," *Appl. Phys. Lett.* 37(10):938-340, Nov. 15, 1980.

Galatsis et al., "p- and n-type Fe-doped SnO$_2$ gas sensors fabricated by the mechanochemical processing technique," *Sensors and Actuators* B 93:562-565, 2003.

Hui Chong Vince Ng et al., "Lateral Connection for a Via-Less Thin Film Resistor," U.S. Appl. No. 12/862,589, filed Aug. 24, 2010, 50 pages.

Hwang et al., "A novel structured polysilicon thin-film transistor that increases the on-off current ratio," *Semicond. Sci. Technol.* 18:845-849, 2003.

Olivier Le Neel et al., "Multi-Layer Via-Less Thin Film Resistor," U.S. Appl. No. 12/862,594, filed Aug. 24, 2010, 48 pages.

Olivier Le Neel et al., "Thermo Programmable Resistor Based ROM," U.S. Appl. No. 12/981,379, filed Dec. 29, 2010, 79 pages.

Privitera et al., "Morphological and electrical characterization of Si$_x$Cr$_y$C$_z$B$_v$ thin films," *Microelectronic Engineering* 87:430-433, 2010.

Sukhawuttichai et al., "Effect of Bi$_2$O$_3$ Addition on the Microstructure and Properties of the SnO$_2$ Varistor System," *33$^{rd}$ Congress on Science and Technology of Thailand,* Walailak University, Nakhon Si Thammarat, Thailand, Oct. 18-20, 2007, pp. 1-4.

Ting Fang Lim et al., "Via-Less Thin Film Resistor with a Dielectric Cap," U.S. Appl. No. 12/862,599, filed Aug. 24, 2010, 46 pages.

Yamauchi et al., "Polysilicon Thin-Film Transistors with Channel Length and Width Comparable to or Smaller than the Grain Size of the Thin Film," *IEEE Transactions on Electron Devices* 38(1):55-60, Jan. 1991.

Tuite, D. "Resistor Trimming," Electronic Design, ED Online #17261, URL= http://electronicdesign.com/article/power/resistor-trimming17261.aspx, dated Oct. 25, 2007.

Extended European Search Report, dated Jul. 27, 2012, for European Application No. 11178590.3, 11 pages.

Le Neel, "Resistor Thin Film MTP Memory, "U.S. Appl. No. 13/953,626, filed Jul. 29, 2013, 88 pages.

Le Neel, "Resistor Thin Film MTP Memory, "U.S. Appl. No. 13/953,626, Notice of Allowance mailed Sep. 26, 2013, 17 pages.

Le Neel, "Resistor Thin Film MTP Memory," U.S. Appl. No. 13/953,626, Notice to File Corrected Application Papers Mailed Dec. 6, 2013 and Response filed Dec. 11, 2013, 6 pages.

* cited by examiner

THIN FILM METAL-DIELECTRIC-METAL TRANSISTOR

BACKGROUND

1. Technical Field

The present disclosure relates to transistors in integrated circuits and, more particularly, to thin film transistors having metal in the channel region.

2. Description of the Related Art

Integrated circuits are used in a large variety of applications. Individual integrated circuits can take the form of voltage amplifiers, voltage regulators, digital signal processors, microcontrollers, wireless adapters, microprocessors, smart cards, and many other devices. Some integrated circuits have circuitry that performs many of these functions on a single chip.

The transistor is the fundamental building block of most integrated circuits. Digital integrated circuits generally use large numbers of transistors as switches to perform all manner of computing operations. The larger the number of transistors, the more complex and powerful an integrated circuit can be. The miniaturization of the transistor in integrated circuits has allowed for billions of transistors to be formed in individual integrated circuits. The complex arrangement of so many transistors has allowed for powerful yet small electronic devices to be manufactured.

The transistor is also used as an analog device in integrated circuits. For instance, the trandsconductance characteristics of transistors allows them to be used as signal amplifiers. A small change in voltage at one terminal of a transistor can lead to a relatively large change in current flowing between other terminals of the transistor. Transistors are used in circuits with passive analog circuit elements such as resistors, capacitors, and inductors to form powerful and complex analog electronic devices.

In current technology, transistors are generally formed at the surface region of a monocrystalline semiconductor substrate. The channel region of each transistor is formed in the single crystal semiconductor substrate. The surface area of the substrate is a limiting factor in the number of transistors that can be formed at the surface of the substrate. Monocrystalline semiconductor substrates are expensive to form and are limited in size.

Physical limitations will eventually halt the miniaturization of transistors at the surface of semiconductor substrates. Due to the expense and difficulty in forming large monocrystalline semiconductor substrates, simply increasing the area of the semiconductor substrate leads to increased cost of the integrated circuit.

BRIEF SUMMARY

In one embodiment of the invention the channel region of a transistor is formed from a metallic semiconductor thin film deposited on a dielectric substrate. The metallic semiconductor thin film is formed of metal and semiconductor material. Because the metallic semiconductor thin film is not monocrystalline, it can be formed inexpensively on a dielectric substrate. Source and drain regions are formed on either side of the channel region. A dielectric layer overlaps the channel region. A gate electrode is formed over the adjacent the metallic semiconductor thin film. A gate dielectric separates the gate electrode from the metallic thin film. Source and drain electrodes contact the respective source and drain regions in the metallic thin film.

The conductivity of the channel regions in the metallic thin film is altered by applying a voltage to the gate electrode. Current flowing between the source and drain electrodes can be turned on or off by applying an appropriate voltage to the gate electrode.

The metallic thin film transistors can be formed on top of a dielectric layer at any level in the semiconductor die. In this way thin film transistors can be easily formed from the metallic semiconductor thin film at multiple levels of the integrated circuit, greatly increasing the number of transistors that can be formed in a single integrated circuit.

In one embodiment the metallic thin film is a thin film layer of chromium silicon. The thin film layer of chromium silicon can be deposited by physical vapor deposition (PVD). The thin film of chromium silicon can be very thin, for example 10 nm. The gate dielectric and gate electrode can likewise be very thin. This allows a very large number of transistor layers to be stacked vertically one above the other throughout the integrated circuit.

The source and drain electrodes can be formed in direct contact with source and drain regions in the thin film of chromium silicon without additional doping of the contact regions. This allows simplification of the process by eliminated doping steps and high temperature annealing processes. The lack of high temperature annealing processes allows for a large selection of materials to be used for source, drain, and gate electrodes.

In other embodiments, the transistors may be formed from materials other than chromium silicon. Other thin films of semiconductor materials incorporating metal atoms can be used to form the transistors.

The present application has some aspects of the disclosure which overlap and are similar to application entitled Thermo Programmable Resistor Based Rom filed on the same day as the present application and having common ownership therewith and bearing application Ser. No. 12/981,379.

DETAILED DESCRIPTION

Figure 1A:
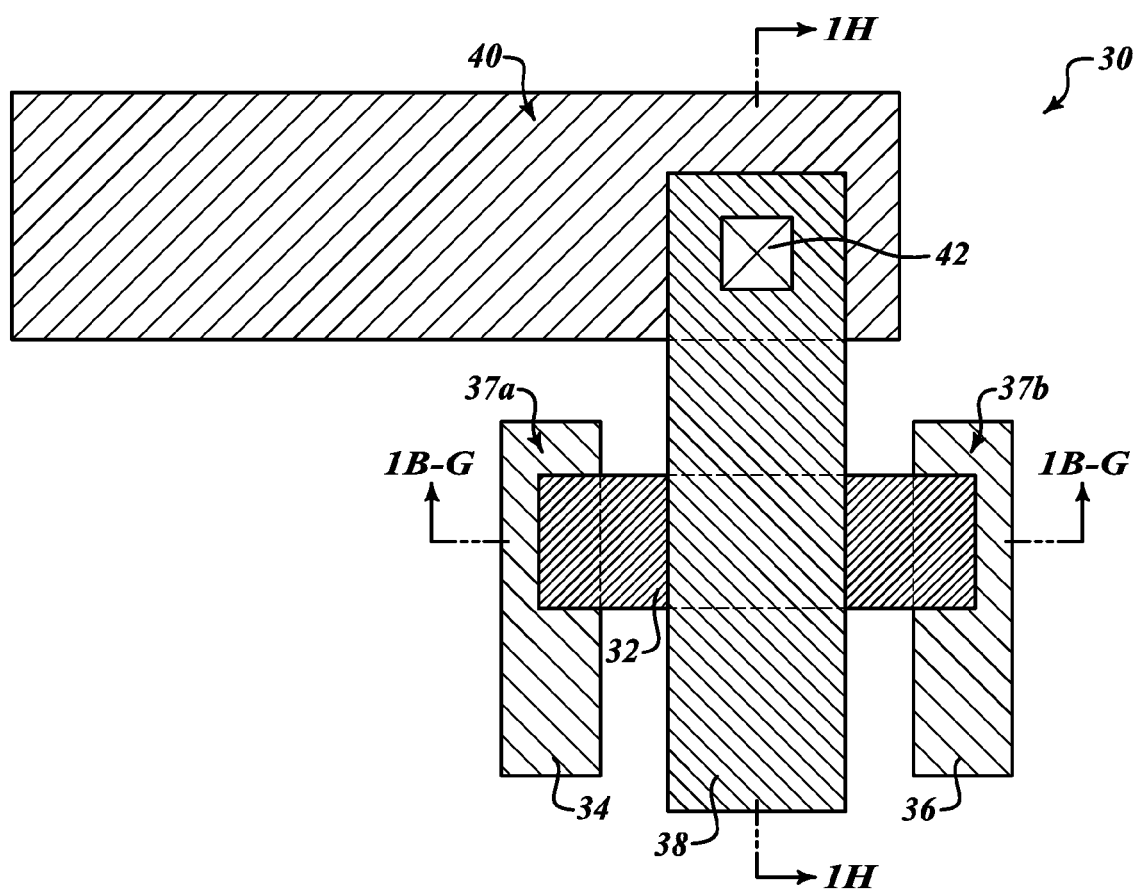
FIG. 1A shows a layout of a thin film transistor according to one embodiment of the invention.

FIG. 1A illustrates a layout of a thin film transistor 30 according to one embodiment. The thin film transistor 30 has a thin film layer of chromium silicon 32. The thin film layer of chromium silicon 32 is a current carrying portion of the transistor that includes the source drain and channel regions. The thin film layer of chromium silicon 32 overlies and contacts source electrode 34 and drain electrode 36 at locations 37a and 37b respectively. Gate electrode 38 overlies the thin film layer of chromium silicon 32. Gate electrode 38 does not contact the thin film layer of chromium silicon 32, rather there is a gate dielectric between the channel region and the gate electrode. The portion of the thin film layer of chromium silicon 32 directly below the gate electrode 38 is a channel region of the transistor 30. Gate electrode 38 contacts metal track 40 at contact region 42.

The basic function of the thin film transistor 30 is to control a current in the thin film layer of chromium silicon 32 by raising or lowering a voltage applied to the gate electrode 38 when a voltage is applied between the source and drain electrodes 34, 36. The voltage on the gate electrode 38 controls the conductivity of the thin film layer of chromium silicon 32 to allow a current to flow between the source and drain electrodes 34, 36 or to inhibit a current from flowing between the source and drain electrodes 34, 36. The formation and structure of the transistor 30 are more particularly laid out in FIGS. 1B-1G in which process steps for forming the transistor are illustrated in relation to a cross-section of the transistor 30 taken along line 1B-1G.

Figure 1B:
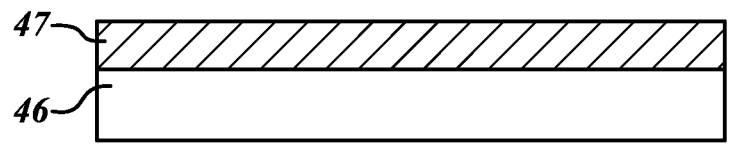
FIGS. 1B-1G illustrates a first cross section of the thin film transistor of FIG. 1A taken at various stages of manufacture.

FIG. 1B is a cross section of the thin film transistor 30 of FIG. 1A at an early stage of processing. In FIG. 1B a first conductive layer 47 is deposited on a dielectric substrate 46. The dielectric substrate 46 is for example silicon oxide, but can be any standard insulator such as glass, silicon carbide, sapphire, silicon nitride, or other suitable insulators.

The layer 47 is any highly conductive material, for example, a conductive aluminum alloy of a type commonly used in semiconductor circuits, such as aluminum with a small content of silicon, 2%, for example, and a small amount of copper, 2%-5%, for example, but other materials may be used. In one embodiment, layer 47 is metal, but it can be made of any highly conductive material. Other materials for conductive layer 47 may include conductive materials commonly used in metal interconnection lines, vias, or contacts of integrated circuits, for example, pure metals of Al, Cu, W, Ti and others. In FIG. 1B the layer 47 is shown as a single layer of conductive material, but in practice it may be formed of more than one layer. For example the layer 47 may be sandwiched between a thin barrier layer of Ti below and a thin antireflective layer of TiN above. The total thickness of layer 47 is between 100 and 500 nm.

Figure 1C:
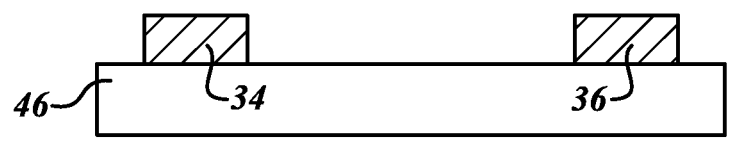

In FIG. 1C the conductive layer 47 has been patterned and etched to form source electrode 34 and drain electrode 36. The patterning can be done by conventional photolithography methods including depositing a layer of photoresist and exposing it through a mask to ultraviolet radiation. A suitable wet etch, dry etch, plasma dry etch, or other method may be used to etch the metal layer 47 according to material selected for layer 47.

Figure 1D:
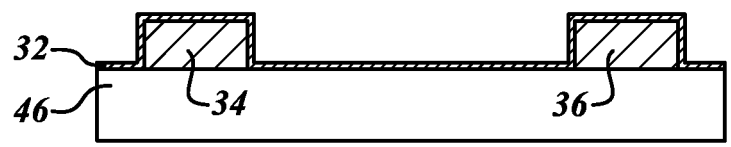

As shown in FIG. 1D, a thin film layer of chromium silicon 32 is deposited on the exposed dielectric substrate 46 and on source and drain electrodes 34, 36. The thin film layer of chromium silicon 32 is for example 10 nm in thickness. In one embodiment the thin film layer of chromium silicon 32 has conductive properties of a p-type semiconductor material.

The thin film layer of chromium silicon 32 is deposited for example by physical vapor deposition, but may be formed by any suitable method. In one embodiment the thin film layer of chromium silicon 32 is deposited by sputtering. Sputtering is a process in which a thin film is deposited on a surface by bombarding a target material with high energy particles. Atoms from the target material are ejected from the target material and deposited on the exposed surface on which the thin film will be formed. The thickness of the deposited thin film can be controlled by the sputtering time, the temperature in the sputtering chamber, the pressure in the sputtering chamber, and the energy of the bombarding particles.

In one embodiment the thin film layer of chromium silicon 32 is formed by sputtering a target comprised, by weight, of 45% Si, 35% SiC, and 20% $CrB_2$. The bombarding atoms are for example, Ar. An inert gas, for example $N_2$, is introduced in the sputtering chamber with a flow rate of 2 std $cm^3$/min. The temperature of the substrate 46 is kept at 350° C. during the sputtering process. The chromium silicon film 32 can be deposited by any acceptable technique known by those of skill in the art, more examples of which are described in a publication entitled S. Privitera, et al., "Morphological and Electrical Characterization of $Si_xCr_yC_zB_v$ Thin Films," Microelectronic Engineering 87:430-33 (2010). These deposition conditions are given by way of example, other deposition conditions may be used to form the thin film layer of chromium silicon 32 as will be apparent to those of skill in the art in view of the present disclosure.

The use of SiCr for various other purposes has been described in other co-pending applications that are commonly owned, including publication number 2010/0073122 and pending application Ser. Nos. 12/862,589; 12/862,594 and 12/862,599.

The thin film layer of chromium silicon 32 contains boron atoms in one embodiment due to the presence of boron in the target material. The boron in the thin film layer of chromium silicon 32 can act as a source of charge carriers in the thin film layer of chromium silicon 32. Carbon atoms may also be present in the thin film layer of chromium silicon 32 due to the presence of Carbon in the target material. In some embodiments, it will be preferred to have a layer containing only chromium and silicon, in which case a target will be used that has no boron and carbon. The sheet resistance of the thin film layer of chromium silicon 32 is about 1.5MΩ/square. The dimensions of the thin film layer of chromium silicon 32 is about 10 squares.

Figure 1E:
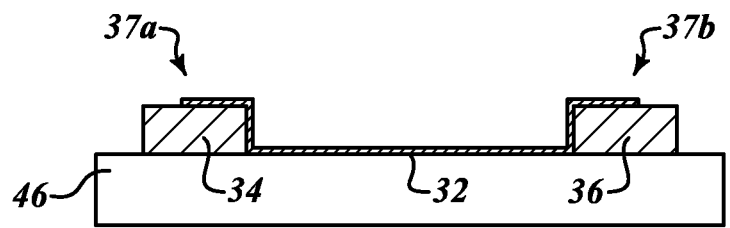

As shown in FIG. 1E, the thin film layer of chromium silicon 32 is patterned and etched leaving the thin film layer of chromium silicon 32 on the substrate 46 between source electrode 34 and drain electrode 36. The thin film layer of chromium silicon 32 is in contact with source electrode 34 and drain electrode 36 at locations 37a, and 37b respectively. The patterning and etching of the thin film layer of chromium silicon 32 may be done using standard photolithography techniques as described above. The etching of the thin film layer of chromium silicon 32 is done with an etchant that selectively etches chromium silicon relative to the materials used for substrate 46, and source and drain electrodes 34, 36.

One advantageous feature of a thin film transistor 30 according to one embodiment is that there is very little capacitance between the source/drain electrodes 34, 36 and the thin film layer of chromium silicon 32. In traditional CMOS technology, one impediment to obtaining fast switching speeds is that there is a high capacitance between the source/drain electrode and the doped source/drain regions in the semiconductor substrate. A thin film transistor 30 according to one embodiment does not suffer from this impediment. There is very little capacitance between the source/drain electrodes 34, 36 and the thin film layer of chromium silicon 32. Furthermore, it is not necessary to perform specialized doping processes on the thin film layer of chromium silicon 32 in order to form a good electrical contact with the source/drain electrodes 34, 36. This reduces the number of process steps to be performed when forming a thin film transistor 30 according to one embodiment.

Figure 1F:
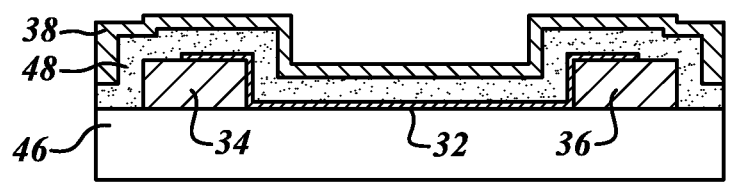

In FIG. 1F a gate dielectric material 48 is deposited on the thin film layer of chromium silicon 32, on source and drain electrodes 34, 36, and on the substrate 46. The gate dielectric material 48 has a thickness of about 20-50 nm. The gate dielectric material 48 is for example silicon $Si_3N_4$, but may be any other suitable dielectric such as $SiO_2$ or a high k-dielectric.

A conductive gate material 38 is then deposited on dielectric material 48. The gate material is 50 nm in thickness in one embodiment. The gate material is for example TaAl, but other conductive materials may be used. For example gate material 38 may be Al, polysilicon, Cu, or other suitable conductive materials.

Figure 1G:
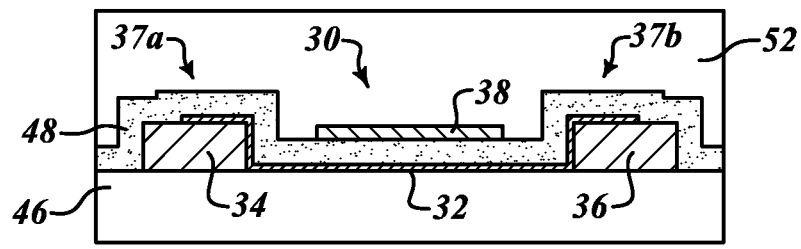

In FIG. 1G gate material 38 has been patterned and etched leaving gate electrode 38 above the thin film layer of chromium silicon 32 with gate dielectric 48 between them. In traditional CMOS technology, the threshold voltage and other parameters that determine the turn of characteristics of on the transistor is in part determined by the difference in work function of the channel region-gate dielectric pairing, and the gate electrode-gate dielectric pairing. In traditional CMOS technology, the gate dielectric and gate electrode are chosen carefully to obtain as small a difference in work functions as possible. For this reason polysilicon has often been selected as a gate electrode material because it is similar to the silicon channel and the difference in work functions is small, allowing for low voltages to be used for turning the transistor on and off. Advantageously, in a transistor having metal in the channel region, the choice of the gate electrode material in a thin film transistor 30 according to one embodiment does not make much of a difference in the threshold voltage and other turn on characteristics of the thin transistor 30 due to the thin film layer of chromium silicon 32. Thus a larger range of materials are available that can be used for the gate electrode 38.

FIGS. 1A-1G indicate some amount of lateral space between the source electrode 34 and the gate electrode 38, as well as between the drain electrode 36 and the gate electrode 38. In practice these lateral distances will be minimized as much as possible so that the gate electrode 38 is above nearly all of the of thin film layer of chromium silicon 32 between the source and drain electrodes 34, 36. For example, the gate electrode 38 can extend across the entire region between the source and drain electrodes 34, 36 and be separated from them only by the gate dielectric. This will reduce the resistance of the thin film layer of chromium silicon 32 when the transistor 30 is in the on state.

A passivation layer 52 is then deposited over gate electrode 38 and gate dielectric material 48. The passivation layer 52 is deposited to a thickness of about 1 μm. The passivation layer 52 is for example $SiO_2$, but may be any other suitable dielectric material. In practice the passivation layer 52 may be formed of multiple dielectric layers including layers of $SiO_2$, $Si_3N_4$, planarizing layers such as spin on glass, or other dielectric layers. The portion of the thin film layer of chromium silicon 32 below the gate electrode 38 is a channel region of transistor 30.

Figure 1H:
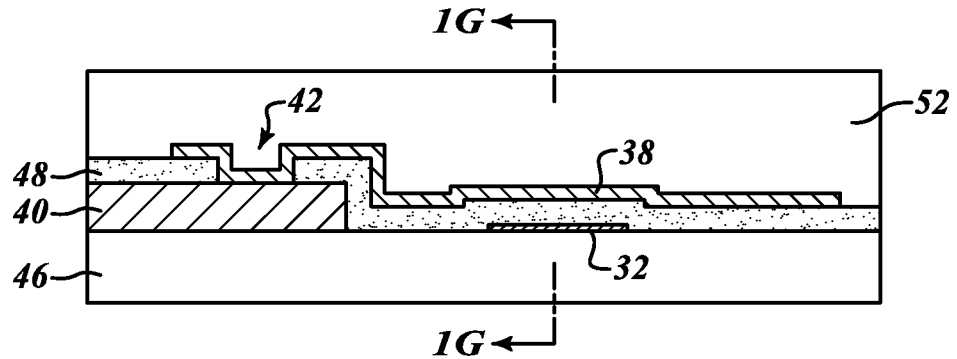
FIG. 1H illustrates a second cross section of the thin film transistor of FIG. 1A.

FIG. 1H is a cross section of the completed transistor 30 of FIGS. 1A-1G taken along line 1H-1H as shown in FIG. 1A. Line 1H is perpendicular to line 1B-G of FIG. 1A. FIG. 1H therefore shows a different view of the structure of the transistor 30 of FIGS. 1A-1G. In particular, FIG. 1H shows gate electrode 38 contacting metal track 40 at contact 42. Gate dielectric 48 has been etched at contact 42 so that gate electrode 38 contacts metal track 40 at 42. Gate electrode 38 extends perpendicular to the thin film layer of chromium silicon 32 and overlies a portion thereof constituting a channel region of the thin film layer of chromium silicon 32. Metal track 40 is formed of the same material and at the same time as source and drain electrodes 34, 36. In other words, when metal layer 47 is patterned and etched to form source and drain electrodes 34, 36, it is also patterned and etched to form metal track 56.

Figure 1I:
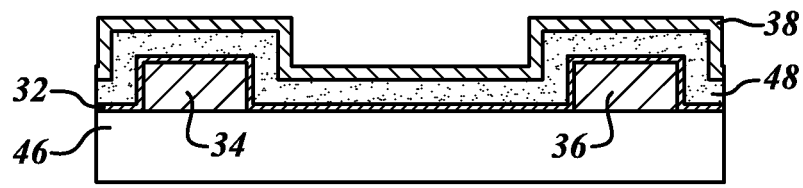
FIG. 1I is a cross-section of a thin film transistor according to one embodiment.
Figure 1J:
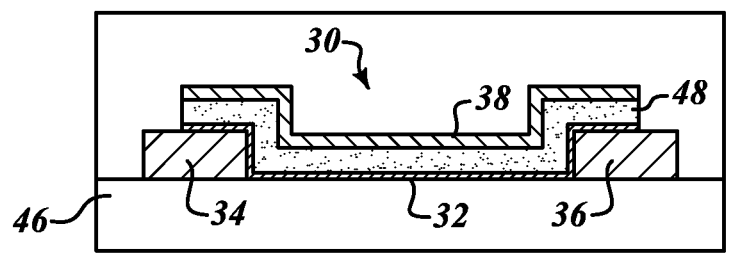
FIG. 1J is a cross-section of a thin film transistor according to one embodiment.

In one alternative, the thin film transistor 30 is made with fewer process steps than is possible in making transistors as is currently known in the art. FIGS. 1I and 1J illustrate an alternative embodiment in which much fewer process steps are used in order to construct the transistor. In this alternative embodiment, after the blanket deposition of thin film layer of chromium silicon 32, the gate dielectric material 48 is deposited after which the gate electrode 38 is deposited, all in blanket form on top of each other as shown in FIG. 1I. After the blanket deposition of the three layers, a single mask is used to pattern and etch the three layers as shown in FIG. 1J. Thus, the gate electrode 38, the gate dielectric 48 and the source drain regions 34 and 36 are self aligned with respect to each other having all been etched with a single photolithographic mask.

In one embodiment, an etchant is selected which is able to etch each of the materials for gate electrode 38, dielectric layer 48 and channel material 32 in a single etch step and the metallic layer that forms the source drain electrodes 34 and 36 is an etch stop. Namely, the etchant is able to etch each of layers 38, 48 and 32 and is selective with respect to the material used for layer 36. In another alternative embodiment, an etching process is used which selectively etches each of the four materials with respect to each other. Namely, after the photolithographic mask is formed, a first etchant is used which is selectively etchable to the gate electrode 38 and stops on gate dielectric 48. The etching chemistry is then changed to etch layer 48 with respect to layer 32 so that the etching stops on layer 32. The etch chemistry is then changed to selectively etch layer 32 with respect to the metallic layer for the electrodes 34 and 36. Whether the etching of layers 38, 48, and 32 is carried out in a single etch chemistry or in three successive etching chemistry, the use of a single mask to define all three layers greatly reduces the processing steps and also provides the assurance that the gate electrode, the gate dielectric and the source and drain regions will be self aligned with respect to each other. The use of only a single mask also saves considerable photolithographic steps, each of which requires alignment and photoresist steps and thus, even if multiple etch chemistries are required, significant savings are still available because only a single mask is used.

The process for forming a thin film transistor 30 as described in relation to FIGS. 1A-1H is described only by way of example. The thicknesses of the layers and structures, materials used for the layers and structures, and the relative positions of the layers and structures are given only by way of non-limiting example. Many other materials, thicknesses, and configurations are possible as will be apparent to those of skill in the art in light of the present disclosure.

In one embodiment the thin film transistor 30 is a p-type field effect transistor. By applying a higher voltage to the source electrode 34 than to the drain electrode 36, and by applying a lower voltage to the gate electrode 38 than to the source electrode 34, the transistor can be switched to an "on" state characterized by increased conductivity of the thin film layer of chromium silicon 32. By applying a same voltage on the gate electrode 38 and the source electrode 34, the thin film transistor 30 can be held in an off state characterized by reduced conductivity of the thin film layer of chromium silicon 32 and little to no current flow from the source to the drain. The voltage on the gate electrode 38 thus controls the conductivity of the thin film layer of chromium silicon 32.

The present thin film transistor also has the distinct advantage that there is no leakage current through the substrate that supports the source and drain regions. The substrate 46 is a dielectric layer. In semiconductor circuits currently made in which a substrate of single crystal silicon, small currents due to parasitic effects, leakage currents and other phenomena may result in small current flow even when the transistor is completely off. The small current flow may be current from the source or drain through the substrate to ground, between the source and the drain or, in some instances, between adjacent transistors due to parasitic effects. According to principles of the present invention, since the base substrate 46 is dielectric, there will be little or no current flow due to these various phenomena when the transistor is turned off. Parasitic effects and cross-talking between adjacent transistors will be eliminated, as will be leakage currents through the substrate. While there may be some very small leakage current from the source to the drain, when the transistor is off, the elimination of the other sources of small current flows which are currently present in monocrystalline silicon transistors are able to be eliminated by the transistor as described herein.

The thin film transistor 30 may also be used in very low power circuits. In one embodiment the voltage on the source electrode 34 is 100 mv higher than the voltage on the drain electrode 36. The threshold voltage of the transistor is in the range of 50 MV. To turn the thin film transistor 30 on, the voltage on the gate electrode 38 is brought lower than the voltage on the source electrode 34 by 50 mv. The sheet resistance of the thin film layer of chromium silicon 32 drops from 1.5MΩ/square to about 40 kΩ/square when the thin film transistor 30 is turned on. When the thin film transistor 30 is on, a drain current of about 220 nA flows and the voltage on either the drain or the source or both rapidly changes, depending on the circuit design. The ability to rapidly change the voltage level with every current flow is a significant benefit of the present design. To turn the thin film transistor 30 off, the gate electrode 38 is brought to the same voltage as the source electrode 34. When the thin film transistor 30 is off, an off-current of less than 6 nA flows in thin film layer of chromium silicon 32. This is insufficient to change the voltage at either the source or drain electrodes and thus the transistor is considered off. In other embodiments the thin film transistor 30 may be implemented as an n-type field effect transistor by using n-type dopants in the target sputtering material.

Figure 2A:
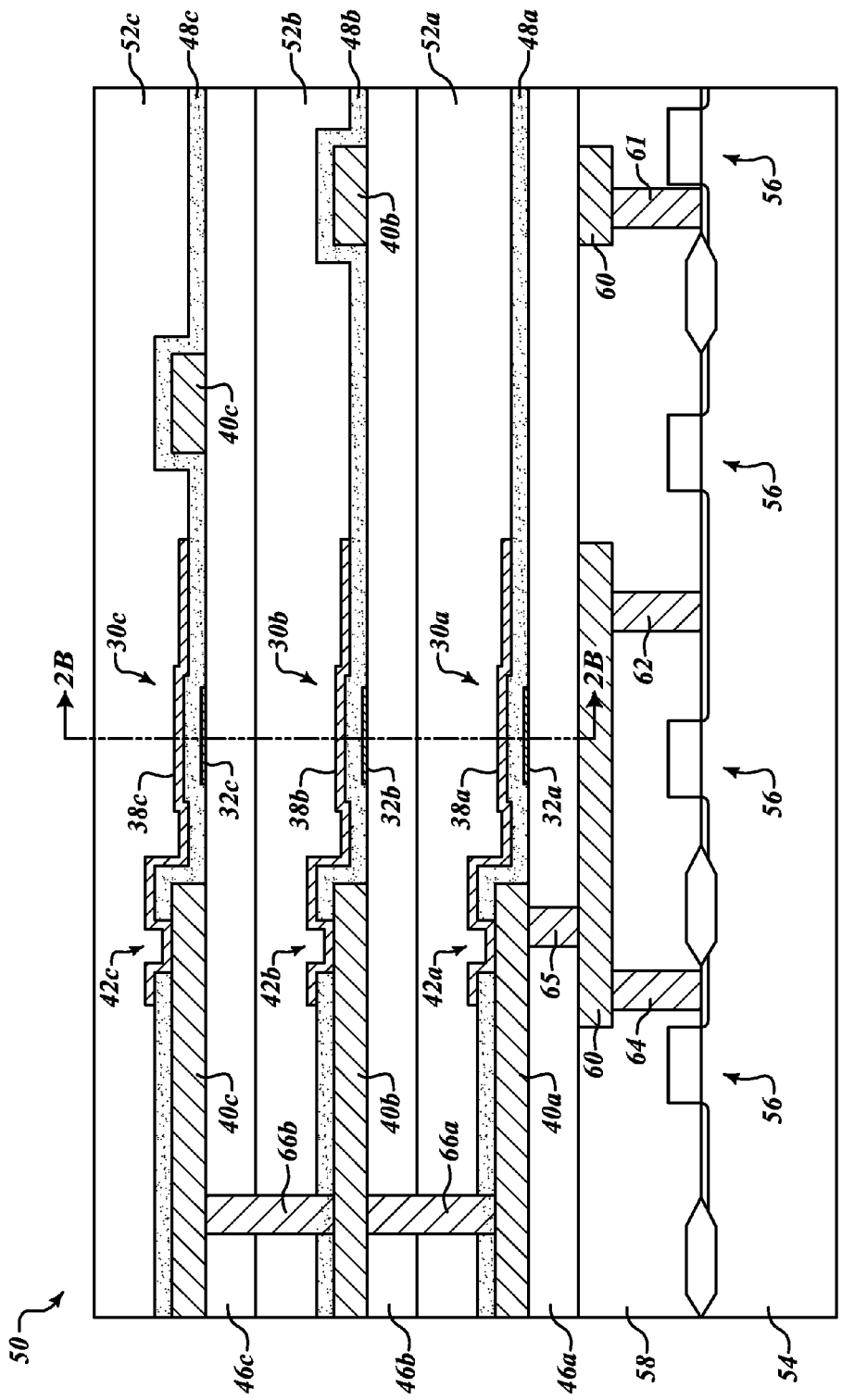
FIG. 2A is a cross section of an integrated circuit according to one embodiment.
Figure 2B:
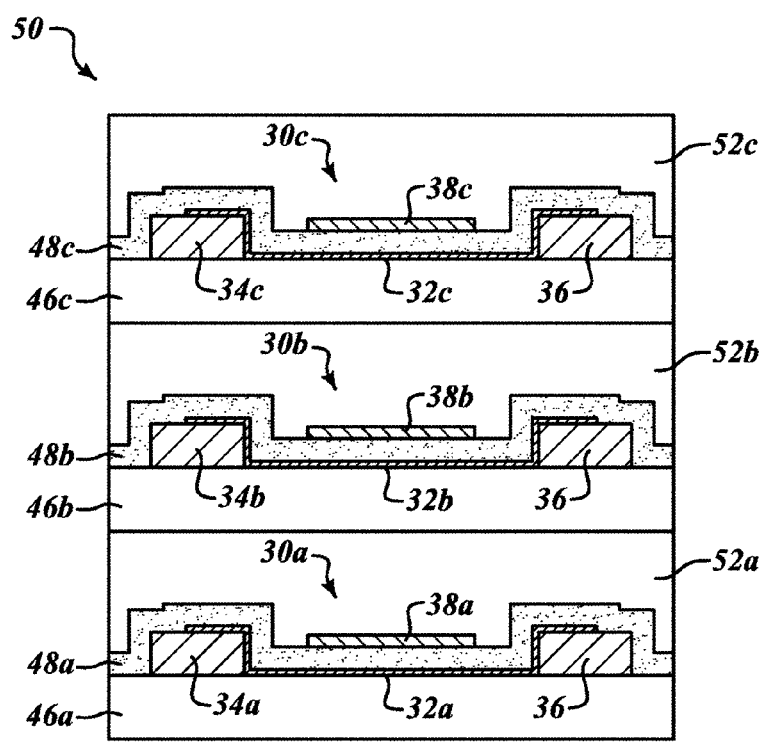
FIG. 2B is a cross section of an integrated circuit according to one embodiment.

FIGS. 2A and 2B show an integrated circuit 50 according to one embodiment. FIGS. 2A and 2B illustrate how thin film transistors 30a-30c can be stacked on subsequent dielectric layers 46a-46c in the integrated circuit 50 to greatly increase the number of transistors that can be formed in an integrated circuit.

In FIG. 2A a monocrystalline semiconductor substrate 54 has been processed in a manner well known in the art to form traditional CMOS transistors 56 at the surface of the substrate 54. A premetal dielectric layer 58 is then formed on the semiconductor substrate 54 and transistors 56. In practice the premetal dielectric layer 58 may contain multiple layers of dielectric materials including various silicon oxide layers, nitride layers, and planarizing layers. The premetal dielectric layer 58 is then patterned and etched to allow formation of metal track 60, and contact plugs 62, 64. Metal track 60 is for example AlSiCu or another suitable conducting material commonly used for metal tracks in integrated circuits. Plugs 62 and 64 are for example W and may include thin Ti and/or TiN barrier layers separating the W from the premetal dielectric layer 58.

Dielectric layer 46a is then formed above the metal track 60 and premetal dielectric layer 58. The dielectric layer 46a is for example silicon oxide, but can be any other suitable dielectric layer.

A thin film transistor 30a is then formed on dielectric layer 46a in substantially similar manner as the transistor 30 described in relation to FIGS. 1A-1H. The view of transistor 30a in FIG. 2A corresponds to the view of transistor 30 shown in FIG. 1H. Transistor 30a includes a thin film layer of chromium silicon 32a, a gate dielectric 48a above the thin film layer of chromium silicon 32a, and a gate electrode 38a above the gate dielectric 48a form in a manner as previously described. Gate electrode 38a contacts metal track 48a at contact 42a. Passivation layer 52a overlies gate electrode 38a and gate dielectric 48a. Plug 65 is formed in dielectric layer 46a and electrically connects metal track 40a with metal track 60.

Dielectric layer 46b is then formed above passivation layer 52a. The dielectric layer 46b is for example silicon oxide, but can be any other suitable dielectric layer. Transistor 30b is then formed on dielectric layer 46b. Transistor 30b includes a thin film layer of chromium silicon 32b, a gate dielectric 48b above the thin film layer of chromium silicon 32b, and a gate electrode 38b above the gate dielectric 48b formed in a manner as previously described. Gate electrode 38b contacts metal track 40b at contact 42b. Passivation layer 52b overlies gate electrode 38b and gate dielectric 48b. Plug 66a connects metal track 40b to metal track 40a.

Dielectric layer 46c is then formed above passivation layer 52b. The dielectric layer 46c is for example silicon oxide, but can be any other suitable dielectric layer. Transistor 30c is then formed on dielectric layer 46c. Transistor 30c includes a thin film layer of chromium silicon 32c, a gate dielectric 48c above the thin film layer of chromium silicon 32c, and a gate electrode 38c above the gate dielectric 48c. Gate electrode 38c contacts metal track 40c at contact 42c. Final passivation layer 52c overlies gate electrode 38c and gate dielectric 48c. Plug 66b connects metal track 40c to metal track 40b.

The embodiment of FIG. 2A therefore illustrates a circuit in which a group of transistors are stacked one atop of the other having all the gate electrodes tied in common. As can be seen, plugs 66a, 66b electrically connect to the gate electrodes 38a, 38b, 38c to each other. In some circuits, it is desired to have the gate electrodes of a number of transistors in common and have the sources and drains connected to different electrical potentials or, in some cases, having either the drain or the sources in common as well. Alternatively, the plugs 66a, 66b may electrically connect other parts of the transistors. For example, the drain transistor 30a may be coupled to the gate of transistor 30b or to the source of transistor 30b or any other circuit connection as may be desired.

The circuit of FIG. 2A also includes additional interconnection lines 60 with plug 61 coupled to the substrate. The additional metal interconnection lines 60 may connect transistors in the monocrystalline substrate 54 to each other to form integrated circuits according to a desired circuit connection. It may also couple selected ones of the transistors in the substrate to selected ones of the transistors at any one of the various levels of thin film transistors 30a-30c. There are other metal interconnection lines 40b and 40c that are part of the metal interconnection lines used to couple circuits in the substrate 54 to each other. Additional lines may also couple various circuits in the upper layers formed from transistors 30a-30c to each other in a manner well known in the art. The metal lines 40a-40c are part of the standard metal interconnection lines that are present in the standard integrated circuit having numerous metal levels. The transistors 30a-30c lay directly on selected ones of these lines and add only a small additional height. Therefore, at every standard metal level, a transistor 30 can be formed without adding significantly to the thickness or complexity of the structure. One advantage of the process for forming additional transistors 30a-30c, according to the embodiments described herein, is that the transistors may easily be formed at the very same metal interconnection layers as would normally be present at an integrated circuit of the type commonly used in the art today. As is well known in the art today, a number of metal layers, such as M1-M6 are normally formed above a monocrystalline silicon substrate 54 in order to interconnect various ones of the transistors with each other and form desired circuits. Standard interconnection lines of metal at the various layers can be used as is currently done in the prior art. At some of the metal lines, a chromium silicon transistor 38 of the type described herein can be formed to provide additional transistors at selected locations as desired. Thus, signal lines 40a, 40b, 40c may be of the same type of selected portions of metal interconnection lines that are formed in CMOS circuits in use today.

The dielectric layers between the metal lines 40a-40c can be the standard intermetal dielectrics in use today. These are normally constructed of various layers of oxides, nitrides, silicon carbide, low-k dielectrics and the like. The layer 46 just below the level that contains the transistors is selected to have sufficient strength and electrical insulation properties to support the transistor 30a-30c. Silicon nitride is an acceptable choice for layers 46a-46c, as are a number of other dielectrics.

According to circuits which are made today in which all transistors are at the same horizontal level and formed in the substrate 54 of a monocrystalline silicon, if it is desired to connected dozens or hundreds of transistors together, a number of metal interconnection lines must be used at the various metal layers in order to appropriately connect the transistors together in a desired complex circuit. For example, if forming a CPU, an arithmetic logic unit (ALU) or other complex circuit components in which a number of transistors must interact to perform a desired logic function, a large number of metal interconnection layers are required in order to appropriately connect transistors which may be separated from each other by great distances in this single crystal silicon substrate. A circuit constructed according to principles of the present embodiment permit much different circuit connections than was possible in the prior art, resulting in much shorter connection lines, faster signal propagation and tighter packing densities than was previously possible. For example, if dozens of transistors are to be formed in a specific circuit connection, each of these transistors can be in a vertical stack which are positioned one above the other. The distance from one transistor to another will be drastically shorter than was possible in the prior art.

As one example to illustrate the advantages of a circuit designed according to the embodiments described herein, the use of P and N channel transistors can be considered. In many CMOS circuits designed today, one or more N channel transistors are connected in selected ways to one or more P channel transistors. In present circuits made today, a P well and an N well are formed in the semiconductor substrate. The P well and N well must be separately formed and in some cases, some isolation structure is between them. Shallow trench isolation, LOCOS or other isolation structures is often constructed between the transistors of the N-type, between transistors of the P-type and also between the N well and P well to prevent cross talk and ensure proper circuit operation. Thus, significant area is consumed in properly isolating the P channel and N channel transistors from each other and forming the appropriate N wells and P wells.

According to a circuit designed with principles of the present disclosure, the P-type transistors can all be formed in a metal layer directly above, or two or three metal layers above the N-channel transistors. A large section of the substrate can be dedicated to the N-channel transistors which are desired for the CMOS circuit and layer 40a may include all the P-channel transistors for that same circuit. Accordingly, the formation of closely adjacent P wells and N wells are no longer necessary and, thus, considerably more efficient usage can be made of the single crystal silicon substrate 54. Thus, all the transistors in one of the layers, for example 40a, can be made of P-type while the transistors of adjacent layers 40b and 54 can be made of N-type. Electrical circuit interconnections between N- and P-channel transistors are therefore made in very short vertical stacks rather than through extended lines stretching over large areas of the substrate. Considerable savings in distance for signal propagation are therefore realized using vertical stacks of alternating transistors of different types, whether P-channel or N-channel. Much more compact circuit connections can therefore be formed than was possible in the prior art.

According to another embodiment, the transistors which are formed in the chromium silicon layer are selected to be those transistors which are less critical in circuit operation for their performance characteristics and their speed. As is known in the art, some types of transistors such as the drive output transistors and amplifying transistors must have characteristics that are critically controlled and have a high quality in order to provide proper circuit performance. On the other hand, a large number of circuits in an integrated chip need not have such high performance characteristics. Some circuits, such as simple inverters, AND gates, OR gates and other standard logic can operate with less speed, and less current and not impair the operation of the circuit. Therefore, according to one embodiment, circuits for which the transistor performance is critical will be formed in the monocrystalline silicon substrate 54 in order to provide high performance for such critical function. Circuits for which the switching speeds and current drive are not so critical will be formed in transistors 30a-30c and appropriate connected to the other transistors. Accordingly, an integrated circuit designed according to embodiments herein will include a mix of transistors, some of which are formed in the integrated circuit substrate and some of which are formed in the layers above the substrate. The selection of the specific transistors for using throughout the circuit will be made according to the necessary switching characteristics required for each transistor in order to achieve the desired electrical function at the lowest overall cost. The present embodiment permits a circuit designer to select the type of transistor to be used at particular locations in the circuit, whether a monocrystalline silicon transistor or a thin film metal silicon gate transistor 30 according to the desired operating parameters of the circuit being designed. This additional flexibility is provided to circuit designers as a significant advantage which provides not only increased density of transistors, but also permits the mix of transistors selected for each type of circuit to be made based on suitable operating characteristics without being required to use the scarce surface of the monocrystalline silicon substrate 54 for all transistors.

FIG. 2A illustrates how thin film transistors 30a-30c can be stacked to increase the overall number of transistors on a single integrated circuit 50. Traditional CMOS transistors are formed at the surface of monocrystalline semiconductor substrates and thus cannot be easily stacked due to the expense and difficulty of forming vertically stacked monocrystalline semiconductor layers. Transistors 30a-30c are each formed on a dielectric layer 40a-40c that can be easily and inexpensively formed as a part of normal integrated circuit processing steps. While FIG. 2A illustrates three stacked thin film transistors 30a-30c, in practice many more levels of thin film transistors can be easily incorporated into a single integrated circuit. While FIG. 2A illustrates a single thin film transistor 30a-30c formed on each dielectric layer 46a-46c, in practice large arrays of transistors 30a-30c may be formed on a single dielectric layer 46a-46c. The horizontal dimensions of the transistors 30a-30c are based in part upon photolithography techniques. As photolithography techniques allow for smaller horizontal dimensions to be formed, the number of transistors 30a-30c formed on a same dielectric layer can be increased. With the ability to stack thin film transistors 30a-30c, the number of transistors in a single integrated circuit 50 can be increased many fold.

Additionally, an integrated circuit 50 incorporating thin film transistors 30a-30c can be implemented in conjunction with traditional MOS transistors 56. In particular, dielectric layers 46a-46c, on which transistors 30a-30c are formed, can be implemented above a monocrystalline semiconductor substrate 54 on which traditional MOS transistors 56 have been formed. Of course it is also possible to implement transistors 30a-30c in an integrated circuit having no monocrystalline semiconductor substrate 54.

FIG. 2B illustrates the integrated circuit 50 of FIG. 2A taken along cross section 2B. FIG. 2B illustrates thin film transistors 30a-30c. However for simplicity, the layers below dielectric layer 46a are not shown in FIG. 2B. The transistors 30a-30c are formed in substantially the same manner as described in relation to FIG. 1G. Source and drain electrodes 34a, 36a are formed on dielectric layer 46a. A thin film layer of chromium silicon 32a is deposited, patterned and etched. Gate dielectric 48a is deposited on the thin film layer of chromium silicon 32a. Gate electrode 38a is deposited gate on dielectric 48a and is patterned and etched. Passivation layer 52a is then formed on the gate electrode 38a and gate dielectric 48a.

Transistor 30b is formed by forming source and drain electrodes 34b, 36b on dielectric layer 46b. A thin film layer of chromium silicon 32b is deposited, patterned and etched. Gate dielectric 48b is deposited on the thin film layer of chromium silicon 32b. Gate electrode 38b is deposited on gate dielectric 48b and is patterned and etched. Passivation layer 52b is then formed on the gate electrode 38b and gate dielectric 48b.

Transistor 30c is formed by forming source and drain electrodes 34c, 36c on dielectric layer 46c. A thin film layer of chromium silicon 32c is deposited, patterned and etched. Gate dielectric 48c is deposited on the thin film layer of chromium silicon 32c. Gate electrode 38c is deposited gate dielectric 48c and is patterned and etched. Final passivation layer 52c is then formed on the gate electrode 38c and gate dielectric 48c.

There are a number of materials that are suitable for the metal channel transistor in addition to SiCr. As explained, SiCr has the operating characteristics of a p-type semiconductor. Other materials may be used that have the operating characteristics of an n-type semiconductor. For example, the channel region can also be made of a metal oxide semiconductor as SnO2, ZnO2, TiO2, WO3. These materials can be used in layers in which it is desirable to have the features of a n-type semiconductor, which can be integrated, connected in the desired layout and stacked with the thin film techniques described here. Each of these transistors can be set at a desired threshold voltage, Vtn and Vtp, to provide the necessary components of the embodiments as described herein.

The transistor 30 can be doped in a variety of different combinations. In the first embodiment, as described it can be doped with boron as formed by placing doped boron in the target or otherwise introducing it into the chamber during the deposition process. Alternatively, it can be doped with an N-type dopant such as phosphorous or arsenic by introducing these elements into the chamber during formation of the layer 32. Thus, in one embodiment the source, channel and drain are all doped uniformly with the same type of dopant.

In an alternative embodiment, the source and drain may be doped differently than the channel region. In this alternative embodiment, after the transistor has been formed with a gate electrode as shown in FIG. 1G, a dopant is introduced into the chamber and implanted into the source and drain regions. In this embodiment, the gate electrode 38 acts as a shield to the dopant implantation. For example, the semiconductor layer 32 can be formed in the manner previously described using a target having silicon, chromium, boron and carbon present. After the transistor has been formed to the stage in FIG. 1G, it can be doped with more boron to be more heavily doped N-type, or phosphorous or arsenic to introduce N-type dopants into the layer 32. Sufficient N-type dopants are implanted to counterdope and overcome the P-type dopant which is present in the source drain regions. Because layer 38 is a relatively thick metal layer, implantation into the channel region is blocked and the additional dopants are implanted only into the source and drain regions and, after being implanted, are activated by a heating step and diffused slightly under the gate region 38. The dopant can be the same type as is currently in the layer to make the source and drain more highly conductive of the type or of the opposite type that was used in the formation of the layer 32. This particular embodiment forms a transistor of the more conventional type, except that the channel region has metal present.

The metal may be in the form of individual atoms spread throughout the layer 32 or as a mixture or as groups of molecules of silicon chromium interspersed among amorphosilicon or polysilicon. Techniques for forming a standard thin film transistor using polysilicon as the channel region are well known in the art and any of those techniques may be used, some of which are described in the various patents which are incorporated herein by reference.

There are a number of prior art patents which discuss the formation of thin film transistors using polysilicon for the channel region. These include U.S. Pat. Nos. 5,135,888; 5,640,023; and 5,037,766. However, none of these patents teach the incorporation of metal atoms into the channel region and, in particular, none of them teach the use of silicon chromium in the formation of the source, drain and channel regions of a transistor.

Shown in FIGS. 2A and 2B, the various layers of transistors 30a, 30b, 30c will generally be formed alternating in conductivity type. According to one embodiment, the first layer of transistors 30a will be formed as P-type, the second layer directly above it in transistor layer 30b will be formed as N-type, and the next layer above it, 30c, as P-type. The alternating layers of conductivity type can be maintained through additional layers as desired.

A number of benefits in circuit formation are obtained by alternating layers of conductivity type. Particularly, CMOS transistors can be formed by linking adjacent transistors in adjacent layers. In the prior art, circuits which included both P-channel and N-channel transistors required the formation of both N wells and P wells in the substrate with appropriate isolation between them and additional contacts for biasing the well of each to the desired voltage, usually to its own source. This, therefore, required significant additional real estate and consumed a large amount of the area otherwise usable for transistor placement in the monocrystalline silicon substrate 54. According to one embodiment of the invention herein, the monocrystalline substrate 54 is preferably a single well device or, in one embodiment, has large sections which are a single well grouped together. The next layer directly above the silicon layer 54 will include transistors of the opposite conductivity type and therefore vertical connections are made to the transistors needed in the circuit through the vertical connections rather than the horizontal connections as is now formed in the art. As examples of how such circuits can be formed much more efficiently than is possible in current techniques, two specific types of circuits will be described, a 6-T SRAM cell and a standard CMOS inverter. Of course, other types of circuits may be formed and these two types of circuits are provided as examples to illustrate the benefits that can be provided according to various embodiments as described herein.

One embodiment of forming an SRAM cell in the structure shown in FIGS. 2A and 2B has a large section of the substrate 54 doped as a P well for the formation of N-channel transistors. The next layer of transistors above it 30a are all P-channel transistors. In the standard 6-T memory cell, four of the transistors are N-channel devices, namely, the two switching transistors and the two access transistors, and two of the transistors are P-channel, namely, the pull down devices, also called the load transistors. In a standard SRAM as formed in today's technology, both the N-channel and the P-channel transistors are formed in the substrate 54. Since each of these are required to be formed in electrically isolated wells tied to differently voltages, the substrate 54 must be segmented into bands or areas having respective P wells and N wells therein. The appropriate electrical isolation between the wells is required as well as power and ground to each of the wells to bias them to the preferred voltage. An SRAM formed of this type will require at least four independent voltage levels to be provided into the memory cells itself, the bitline, bitline bar, ground, and VCC. In addition, the wordline, which is usually a polysilicon strip, must be provided as the gate to the access transistors as well as the bitline gate for both the bitline bar. Accordingly, the area taken up by the SRAM cell includes not just the area of the transistors in the substrate, but also the additional area needed for electrical contact to the various nodes inside the cell for VCC, ground, bitlines, as well as access to the various gates. And the area needed for the well bias contacts which may be placed every eight memory cells, every 16 memory cells, every 32 memory cells, or at a desired spacing according to the design of the SRAM. An SRAM designed according to principles as described herein can be made considerably smaller with much fewer electrical connections to the substrate and fewer conductive lines running therethrough, thus saving considerable space.

An SRAM memory cells formed according to principles as described herein, has only the N-channel transistors in the substrate 54. These four transistors include the two access transistors and the two pull down transistors. A connection must also be made to the P well to bias it to the desired voltage. The P-channel transistors will be formed in layer 30a directly above the four N-channel transistors. The connection to VCC is provided to the P-channel transistors and need not be provided to the four N-channel transistors. In addition, the substrate tie for the P-channel transistors for the body region is also not needed in the substrate 54, but can be provided as appropriate in layer 30a. In most embodiments, no body tie bias voltage will be needed for transistors 30a, since each of them are electrically isolated from the other. Accordingly, in such embodiments, this contact is not necessary. The connection between the P-channel transistors and the N-channel transistors is made through a vertical plug such as 64 and 65 as shown in FIG. 2A. The gates of the N-channel and P-channel transistors can be electrically connected to each other as can the storage node having the drains of the two transistors coupled together. The number of electrical connections to the substrate 54 is reduced by at least 25% because the VCC contacts to the substrate are no longer needed, nor are contacts needed for coupling the P-channel and N-channel transistors to each other at the substrate level. Before N-channel transistors can be laid out in a patter which is the most beneficial for their operation and design without having to be concerned about the placement of the P-channel transistors adjacent to them, which need to be part of the same SRAM memory cell. Since the P-channel transistors will be directly above and over the four N-channel transistors, the N-channel transistor size, spacing and location can be selected based on the desired parameters of operation and connection solely for N-channel transistors. In addition, as previously pointed out, the space necessary for coupling to the VCC in the middle of the N-channel transistor area is saved as well as ties to the P well and other connections. Thus, the focusing the layout of the N-channel transistors will only be concerned with the N-channel transistors themselves and the appropriate connections thereto.

Directly above the four N-channel transistors will be the two pull down P-channel transistors. The two P-channel transistors will be formed as transistors 30a in the layer, and preferably positioned directly above the four N-channel transistors at the same physical location. It is customary in the art to make a P-channel transistor 20%-30% larger than a corresponding N-channel transistor having similar voltage and current characteristic. Since mobility of charge carriers in P-channel transistors is somewhat less than the mobility of charge carriers in N-channel transistors, the area consumed by the P-channel transistor is often made 20%-30% larger in order to have commensurate voltage and current characteristics to the N-channel. This has caused P-channel transistors to consume more surface area in the substrate than the corresponding N-channel transistors. According to the design of the present embodiments, the P-channel transistors can be made twice as large as each N-channel transistor without further increasing the surface area. Specifically, four N-channel transistors will be formed in the substrate 54. Directly above them two P-channel transistors 38 will be formed. Each P-channel transistor can be made of a size at least double and perhaps triple the width of the N-channel transistors and still fit in the very same footprint over the very same area. The area used by the P-channel transistors must accommodate for connections to VCC but does not need to accommodate for connections to ground or the wordline or the bitline gate electrodes. Accordingly, the P-channel transistors can be formed of a desired size and layout orientation which can be selected to benefit the P-channel transistor operation. The 6-T SRAM cell will now be in the form of a cube rather than a square, as was common in the prior art. Namely, in the prior art, a single SRAM cell had all its transistors essentially at the same level and thus was a two-dimensional cell either in a rectangular form or square form or some other shape to enclose the perimeter of the two N-channel transistors and P-channel transistors which make up a single SRAM cell. However, in making an SRAM cell according to embodiments of the present invention, portions of the cell are now vertically oriented, having two transistors vertically positioned above four transistors so that the SRAM cell itself is more in the form of a cube than a rectangle or a square. The natural characteristic of P-channel transistors having lower mobility of charge carriers than N-channel transistors is also accommodated for since the P-channel transistors can be made twice as large as the N-channel transistors and still not increase the overall footprint and size of the memory cell. Additional space savings have been obtained by removing the need for the ground connection to the P-channel transistors and the VCC connection to the N-channel transistors in the substrate. Connections between the P-channel transistors and N-channel transistors are made through vertical plugs rather than horizontal interconnection lines that were commonly used in the prior art.

The use of P-channel transistors in the thin film provides the benefit of not reducing the performance of the overall SRAM during most of the operation. One role of the P-channel transistors is to ensure low power operation of the SRAM cell. The P-channel transistors as described in the present invention are capable of very low power operation. The higher speed transistors which may consume more power, such as the access transistors during a read or write cycle are formed in the N-channel array in the substrate 54. Thus, advantageously, the transistor function which relies on low power for preferred operation is formed in that layer which is most easily capable of operation with very low power requirements, and those transistors which need higher speed and may consume more power are formed in the monocrystalline silicon substrate 54. Accordingly, the natural characteristics of the respective transistors' N-channel and P-channel are utilized to their distinct advantage in an SRAM cell designed according to principles as described herein.

In a further example of an SRAM cell, the two n-channel transistors that are in the core of the memory cell may be placed in the upper layer 40b, while the two access transistors are in the substrate. This moves the ground connection for the memory cell to one of the upper layers as well, providing further savings, but without sacrificing the switching speeds and current provided on the bit lines when writing or reading, since these are provided in the substrate 54.

One benefit to having the entire memory cell in the upper layers placed on an insulator is that the leakage current will be at or near zero. One of the issues with large memory arrays today is the leakage current from the substrate. Even with isolation wells and other structures to reduce the leakage, it remains an issue in many memory cell designs. Placing the entire memory cell in the layers 40a, 40b and 40c provides the benefit that leakage current and other parasitic currents will be at or near zero.

In yet another embodiment, the SRAM is a 4-T cell in which the material for the p-channel transistors is deposited as a very thin layer, for example, 10 Angstroms or less. This will provide a very high resistance and can be used in as the resistor in a 4-T SRAM cell of the type shown and described in U.S. Pat. No. 4,125,854.

A second example of a circuit which may be formed in much smaller geometries is a standard CMOS inverter. As is known, the standard CMOS inverter includes one N-channel transistor and one P-channel transistor. There are many uses of CMOS inverters in modern integrated circuits. Some CMOS inverters are used as power outputs to provide large drive outputs for delivery downstream. For such CMOS inverters, having a high current capability and rapid turn-on characteristics is preferred. On the other hand, some inverters are used merely for timing adjustments in signal propagation lines. In a number of circuits, a series of CMOS inverters are provided of an even number in order to introduce a time delay into signal propagation lines. For example, signal lines feeding into some logic gates may have no inverters in one line, an even number such as 4-8 inverters in another line, and an additional line having further inverters, such as 20-40 inverters in other lines in order to control the timing of signal delivery into logic units. CMOS inverters of this type are not provided for their large drive signal capabilities but instead are provided for the purpose of placing a time delay into the signal propagation. According to principles as described herein, the first CMOS inverter, one in which a large output drive current is provided having specific turn-on characteristics both the P-channel and N-channel transistors are formed in monocrystalline silicon substrate 54 using design parameters and characteristics well known in the art. Those CMOS inverters for which power performance and particular turn-on characteristics are critical can therefore be formed in the monocrystalline silicon substrate 54. On the other hand, CMOS inverters whose output characteristics do not need to be so large, or whose drive characteristics are not so critical, can be formed in alternating layers of the thin film transistor as described herein. For example, the N-channel transistor can be formed in substrate 54 in the P-channel in the next layer 30a. Alternatively, the P-channel transistor can be formed in layer 30a and the corresponding N-channel transistor formed directly above it in layer 30b. Thus, both transistors, the P-channel transistor and N-channel transistor, for some CMOS inverters can be formed directly one above the other in the stacked layers of thin film transistors according to the present embodiment. The CMOS inverters will be linked to each other through a vertical connection of the type shown in 66a, in which the gates are tied together and in addition the outputs can be tied together through a similar vertical connection. The power supply to the P-channel transistor, VCC, need only be provided to the transistors in level 30a, and the ground connection need be provided only to the transistors in level 30b. Accordingly, the additional space necessary for connections to both VCC and ground are not necessary to making both layers, thus providing considerable space savings over standard CMOS inverters in which contacts for both must be made to the substrate.

Numerous circuits which contain both P-channel and N-channel transistors can be formed using the principles explained herein and the alternating layers of N-channel and P-channel transistors as shown in FIGS. 2A and 2B.

The single crystal substrate 54 can be composed of either type of transistor, N-channel or P-channel, according to the desired design. Usually, the layer directly above the substrate will be of the opposite conductivity type and the layer above it of the same conductivity type as the substrate. If it is desired to provide electrical connections to transistors of the same conductivity type, every other layer can be connected through the appropriate vertical connections as shown in 66a and 66b, skipping alternating vertical layers. Alternatively, the layers can be formed in pairs of conductivity type, having two N-channel layers formed adjacent to each other, after which two P-channel layers are formed adjacent to each other. Such formation of pairing in which two P-channel transistor layers are alternated with two N-channel transistors may have some advantages in permitting two P-channel transistors of adjacent layers to be easily and closely coupled to each other for some circuit designs while providing the easy linking of N- and P-channel transistors on each of the opposite sides of the two P-channel transistors. Namely, for some circuit designs, the two P-channel transistors facing each other can be paired together with a single vertical connection, as shown in 66b. Similarly, an N- and a P-channel transistor can be coupled to each other through adjacent vertical connection as shown in 66a. Thus, this layer combination of having pairs of layers grouped together with alternating pairs of N-channel and P-channel transistor layers, provides significant advantages in some types of circuit connections to permit N-channel transistors to be easily coupled to each other through adjacent vertical connections, P-channel transistors to be coupled to each other through adjacent vertical connections, and also both P- and N-channel transistors to be easily connected to each other through adjacent vertical connections.

The processes for forming thin film transistors 30a-30c may be repeated further to produce as many stacked thin film transistors 30 as desired.

In a preferred embodiment, all of the critical logic transistors for the CPU, output drivers, ALU and the like are in the substrate 54, while all the transistors for the memory cells, registers, PLAs, standard inverters and the like are in the layers above the substrate.

While the preferred embodiments have metal atoms in the channel region, this is not required in all designs. Polysilicon can be used without any metal, but it is preferred to have it deposited at low temperatures, below 350° C. It is thus preferred to avoid LPCVD, which normally has temperatures above 400° C. and to use PVD which can be deposited at a low enough temperature that metal layers are not affected. One drawback of using PVD is a reduction in mobility of the holes/electrons (faster in crystalline mode) but it is compensated for by the fact that there are no diffusion junctions. Thus, the polysilicon can be a uniform conductivity type throughout as described herein for the silicon metal layers, without junctions. If desired, in some designs the source and drain regions can be doped with an impurity to make them the opposite conductivity type of the channel, as also described herein as one possible embodiment for the metal containing channels.

In summary, it is preferred to have low temperature of processing, below 350° C., to avoid any metal deformation of the interconnection lines that were previously deposited for coupling other circuits on the chip. Thin and ultra thin films (10-100 nm) are used to allow easy stacking of transistor levels without adding any metal layers. Each of the transistor layers can fit between a standard intermetal dielectric that is now in use and can be coupled to the metal layers now present in standard semiconductors. It is preferred to use active silicon for high current devices and ESD protection circuits and other logic to permit easy use of existing designs in this area.

Using these characteristics described herein, there is no limitation on the number of levels that can be stacked. The designer can now have a 1 um design rule technology for the front end processing and stack ROM, SRAM, Precision Resistors, and sensors in the various layers above the substrate and achieve a very high performance chip in smaller area than was previously possible. Some chips can be made with a larger design rule than now in use, such as 100 nm, 300 nm or larger and still have a small overall footprint in single crystal silicon. This invention thus provides a road map for the future development of more dense chips, yet having more functionality and lower power. Chips having the functions and performance of the very small design rule, such as 65 nm, 45 nm or 32 nm can now be made using equipment that is only capable of making chips with a design rule of 135 nm or 500 nm. The older equipment can therefore continue to be used to make products and extend its useful life. The need to invest in very expensive new fabrication facilities can therefore be delayed for some years and avoided in some cases.

In the cross-section shown in FIG. 2B, interconnections between the various transistors 30a-30c are not shown, however, such electrical interconnections can easily be made using the techniques described herein. For example, a plug can easily be formed between adjacent drains 36 of transistors 30a and 30b if such type of circuit connection is desired. Similarly, electrical interconnections can be formed between sources and drains of adjacent transistors vertically stacked one above the other. Thus, while interconnection lines between adjacent transistors are not shown in FIG. 2B, the appropriate interconnections can be made according to the desired circuit being formed as previously described.

Figure 3A:
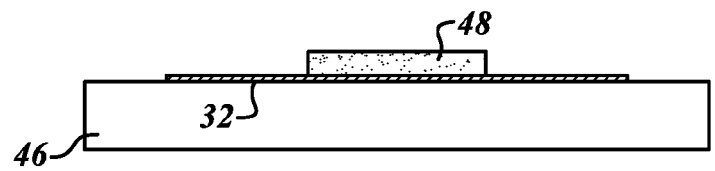
FIGS. 3A-3C illustrate various steps in a process for forming an integrated circuit according to one embodiment.
Figure 3B:
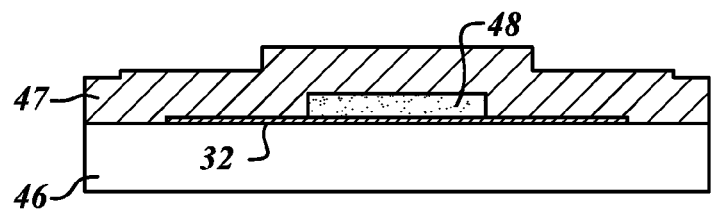
Figure 3C:
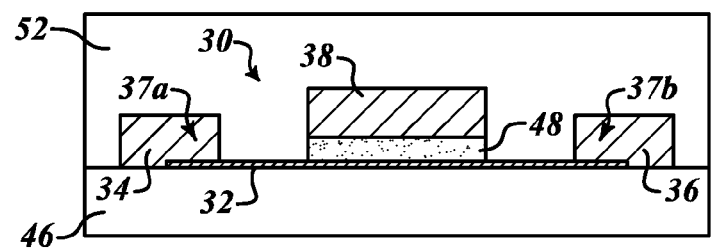

FIGS. 3A-3C illustrate a process for forming a thin film transistor according to one embodiment. In FIG. 3A a thin film layer of chromium silicon 32 is deposited on dielectric substrate 46. A layer of gate dielectric material 48 is deposited on the thin film layer of chromium silicon 32. The gate dielectric material 48 and the thin film layer of chromium silicon 32 are patterned and etched leaving them in the form shown in FIG. 3A. The materials and thicknesses for the thin film layer of chromium silicon 32, the gate dielectric material 48, and the dielectric substrate 46 can be the same as those described in relation to FIGS. 1A-1H.

In FIG. 3B a conductive metal layer 47 is deposited on the dielectric layer 46, the thin film layer of chromium silicon 32, and the gate dielectric 48. The conductive layer 47 may be of the same material and thickness as that metal layer 47 described in relation to FIG. 1B. In FIG. 3C the metal layer 47 is patterned and etched to leave source and drain electrodes 34, 36 on top of and in electrical contact with respective source and drain portions of the thin film layer of chromium silicon 32. Gate electrode 38 is also formed of the metal layer 47. The gate electrode 38 is on top of gate dielectric 48 above the thin film layer of chromium silicon 32. A passivation layer 52 is then deposited on the source, drain and gate electrodes 34, 36, 38, as well as on the thin film layer of chromium silicon 32 and dielectric substrate 46. The passivation layer 52 may be the same material as that described in relation to FIG. 1G.

The embodiment of a thin film transistor 30 described in relation to FIGS. 3A-3C is advantageous because the gate electrode 38 is formed of the same material as the source and drain electrodes 34, 36. This eliminates the need for entire process steps of depositing and etching the gate electrode 38. Instead, the gate electrode 38 is deposited and etched at the same time as the source and drain electrodes 34, 36.

One advantage of the circuit design of FIG. 3C is that the gate electrode 38 and the source and drain electrodes 34 and 36 are self aligned with respect each other and formed in the same mask step. Thus, the gate electrode can be made as close as the minimum line width permits to the source and drain electrode contacts 34 and 36. One of the shortcomings of circuits according to current designs is that the highly conductive electrode contacts to the source and drain regions must be made by a separate mask and etch step, which requires separate alignment and photolithographic techniques. Accordingly, the distance between the drain electrode and gate electrode is larger than is necessary for electrical isolation between the two materials and instead is based on the alignment abilities of multiple masks that must be used in the multiple layers between when the gate electrode is formed and the source and drain electrodes are provided to connected to metal one. Various techniques are used in the prior art in order to minimize this distance and to compensate for errors which may occur in mask alignment tolerances since often three to five photolithographic steps may occur between the formation of the gate electrode and the formation of the source and drain electrode contacts. Use of a single metal layer and a single mask to form both the gate electrode and the source and drain electrodes assures that each of the contacts will be self aligned with respect to each other and eliminates the risk of misalignment of adjacent masks. Thus, the transistor, together with the source and drain electrodes to each transistor can be made significantly smaller than was possible in the prior art.

Figure 3D:
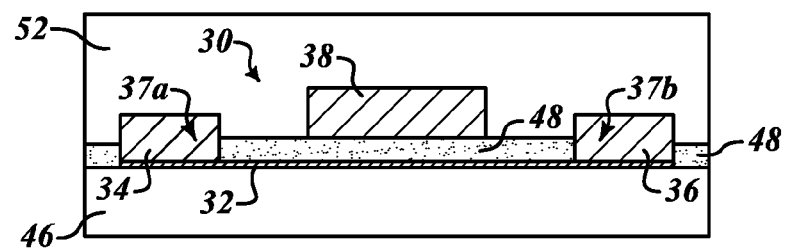
FIG. 3D is a cross-section of a thin film transistor according to one embodiment.

FIG. 3D illustrates another alternative embodiment. In this embodiment, the gate dielectric 48 extends up to and abuts against the source and gate electrodes 34 and 36. When the gate dielectric 48 is etched as shown in FIG. 3A, the shape of the mask is selected to open up the contacts to be made by the source and drain electrodes 34 and 36, respectively, rather than to match the exact size of the gate electrode 38. Thereafter, when the blanket metallic layer is deposited which contains the gate electrode 38, the source and drain electrode 34 and 36 will be deposited into the apertures of the gate dielectric 48 to be in abutting contact with the thin film semiconductor layer 32. The subsequent masking and etch step is selected to define the gate electrode 38 from the source and drain electrodes 34 and 36 and stop on the gate dielectric 48. Accordingly, transistors having the source and drain electrodes significantly closer to the gate electrode than was previously possible in the prior art can be formed, thus increasing the switching speed of the transistor 30.

Figure 4A:
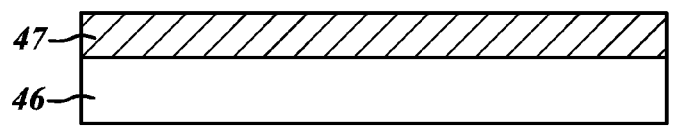
FIGS. 4A-4D illustrate various steps in a process for forming an integrated circuit according to one embodiment.

FIGS. 4A-4D illustrate a process for forming a thin film transistor 30 according to one embodiment. In FIG. 4A a conductive metal layer 47 is deposited on dielectric substrate 46. The materials and thickness for the metal layer 47 and the dielectric substrate 46 can be the same as those described in relation to FIG. 1B.

Figure 4B:
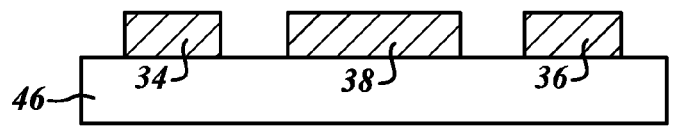
Figure 4C:
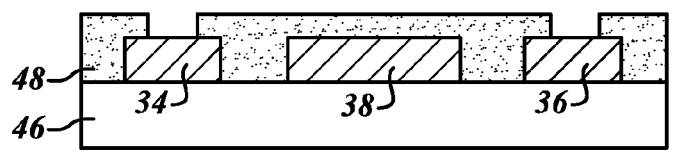

In FIG. 4B the conductive layer 47 is patterned and etched leaving source, drain, and gate electrodes 34, 36, 38 on the dielectric substrate 36. In FIG. 4C a gate dielectric material 48 is deposited over the source, drain, and gate electrodes 34, 36, 38, and over the dielectric substrate 46. The gate dielectric 48 is then planarized, patterned and etched to expose source and drain electrodes 34, 36. The material of the gate dielectric 48 and its thickness above the gate electrode 38 can be those described in relation to FIG. 1F.

Figure 4D:
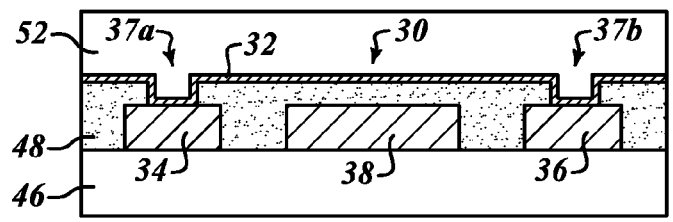

In FIG. 4D a thin film layer of chromium silicon 32 is deposited over the gate dielectric 48 and on exposed portions of source and drain electrodes 34, 36. The thin film layer of chromium silicon 32 contacts the source and drain electrodes 34, 36 at contact regions 37a, 37b. Passivation layer 52 is deposited on the thin film layer of chromium silicon 32. The thin film layer of chromium silicon 32 and the passivation layer 52 can be of the same material and thickness as those described in relation to FIGS. 1A-1H.

Figure 5:
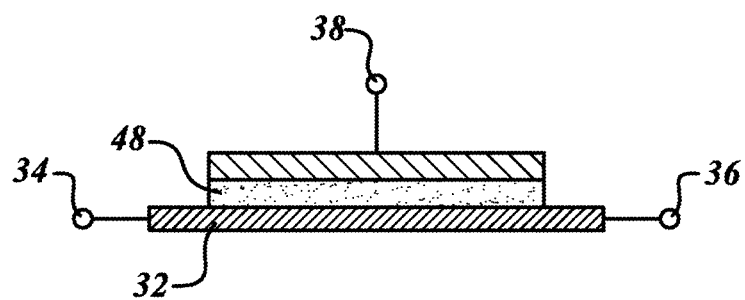
FIG. 5 is a thin film transistor according to one embodiment.

FIGS. 1A-4D have described a thin film transistor 30 having a channel region formed of a thin film layer of chromium silicon 32. However, other materials may be used in forming a thin film transistor 30. FIG. 5 illustrates a thin film transistor 30 according to one embodiment. Thin film transistor 30 is formed of a thin film layer 32 containing metal and semiconductor material. The thin film layer 32 is electrically connected to source electrode 34 and drain electrode 36. A gate dielectric 48 separates the thin film metal layer 32 from a gate electrode 38.

The thin film metal layer 32 may be formed for example, by physical vapor deposition. In one embodiment the thin film layer 32 is formed by sputtering a target containing semiconductor material and metal as described previously. This results in the formation of a thin film layer 32 having metal atoms evenly spread through the thin film layer 32. The target may also contain doping atoms to dope the thin film layer 32 as an n-type or p-type semiconductor. The presence of metal in the thin film layer 32 allows for good electrical connection with source/drain electrodes 34, 36 without the need for further doping process after formation of the thin film. Furthermore, presence of metal in the thin film layer 32 increases conductivity of the thin film layer 32.

The thin film transistor 30 operates by applying a voltage between the source and the drain electrodes 34, 36. A control voltage is then applied to gate electrode 38. The difference between the control voltage and the voltage on the source electrode will determine a conductivity of the thin film layer 32. The control voltage can be used to reduce or increase the conductivity of the thin film layer 32 and thus to control a current in the thin film layer 32.

The various embodiments described above can be combined to provide further embodiments. All of the U.S. patents, U.S. patent application publications, U.S. patent application, foreign patents, foreign patent application and non-patent publications referred to in this specification and/or listed in the Application Data Sheet are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device comprising:
   a first dielectric layer;
   a thin film layer of chromium silicon on the first dielectric layer;
   a source electrode coupled to the thin film layer of chromium silicon;
   a drain electrode coupled to the thin film layer of chromium silicon, wherein the thin film layer of chromium silicon is positioned on a to surface of the source electrode d on a top surface of the drain electrode;
   a gate electrode above the first dielectric; and
   a gate dielectric between the thin film layer of chromium silicon and the gate electrode and overlying the thin film layer of chromium silicon, the source electrode, and the drain electrode.

2. The device of claim 1 wherein the thin film layer of chromium silicon contains boron atoms.

3. The device of claim 2 wherein the thin film layer of chromium silicon contains carbon atoms.

4. The device of claim 1 wherein the gate, source, and drain electrodes are formed of the same material.

5. A method comprising:
   passing a current between a source electrode and a drain electrode through a thin film layer of chromium silicon overlying the source and drain electrodes; and
   applying a first control voltage to a gate electrode to substantially stop the current, the gate electrode being separated from the thin film layer of chromium silicon by a gate dielectric, the gate dielectric overlying the source electrode, the drain electrode, and the thin film layer of chromium silicon.

6. The method of claim 5 wherein passing the current comprises applying a first bias voltage to a drain electrode.

7. The method of claim 6 wherein passing the current comprises applying a second bias voltage to a source electrode.

8. The method of claim 5 further comprising applying a second control voltage to the gate electrode to allow the current to pass through the thin film layer of chromium silicon.

9. The method of claim 5 wherein applying the first control voltage generates an electric field that alters the conductivity of the thin film layer of chromium silicon.

10. A method comprising:
forming a source electrode above a dielectric substrate;
forming a drain electrode above the dielectric substrate;
forming a thin film layer of chromium silicon above the dielectric substrate, on a top surface of the source electrode, and on a top surface of the drain electrode;
forming a gate electrode above the dielectric substrate; and
forming a gate dielectric between the thin film layer of chromium silicon and the gate electrode, the gate electrode being electrically insulated from the thin film layer of chromium silicon.

11. The method of claim 10 comprising applying a control voltage to the gate electrode to allow a current to pass from the drain electrode through the thin film layer of chromium silicon.

12. The method of claim 10 comprising applying a control voltage to the gate electrode to inhibit a current from passing from drain electrode through the thin film layer of chromium silicon.

13. The method of claim 10 forming the thin film layer of chromium silicon by physical vapor deposition.

14. The device of claim 10 comprising forming the gate dielectric above the source electrode and the drain electrode.

* * * * *

UNITED STATES PATENT AND TRADEMARK OFFICE
CERTIFICATE OF CORRECTION

PATENT NO.         : 8,809,861 B2
APPLICATION NO.    : 12/981375
DATED              : August 19, 2014
INVENTOR(S)        : Olivier Le Neel et al.

It is certified that error appears in the above-identified patent and that said Letters Patent is hereby corrected as shown below:

In the claims

Column 20, Line 40:
"is positioned on a to surface of the source electrode d on" should read, --is positioned on a top surface of the source electrode and on--.

Signed and Sealed this
Thirteenth Day of October, 2015

Michelle K. Lee
*Director of the United States Patent and Trademark Office*